United States Patent
Ikezawa

(10) Patent No.: US 9,241,419 B2
(45) Date of Patent: Jan. 19, 2016

(54) BRACKET AND ELECTRONIC DEVICE

(71) Applicant: TDK Corporation, Tokyo (JP)

(72) Inventor: Akira Ikezawa, Tokyo (JP)

(73) Assignee: TDK Corporation, Tokyo (JP)

( * ) Notice: Subject to any disclaimer, the term of this patent is extended or adjusted under 35 U.S.C. 154(b) by 131 days.

(21) Appl. No.: 13/680,258

(22) Filed: Nov. 19, 2012

(65) Prior Publication Data

US 2013/0170113 A1 Jul. 4, 2013

(30) Foreign Application Priority Data

Dec. 28, 2011 (JP) ................. 2011-287496

(51) Int. Cl.
*H05K 7/00* (2006.01)
*H05K 7/14* (2006.01)
*H05K 5/02* (2006.01)
*H05K 7/12* (2006.01)
*H02G 15/00* (2006.01)

(52) U.S. Cl.
CPC ............ *H05K 7/1401* (2013.01); *H05K 5/0247* (2013.01); *H05K 7/00* (2013.01); *H05K 7/12* (2013.01); *H02G 15/00* (2013.01)

(58) Field of Classification Search
CPC .................................... H05K 7/00; H05K 7/14
USPC ........... 248/73, 74.1, 74.4, 316.1; 361/679.01
See application file for complete search history.

(56) References Cited

U.S. PATENT DOCUMENTS

| | | | |
|---|---|---|---|
| 3,804,359 A | | 4/1974 | Cumber |
| 4,917,615 A | * | 4/1990 | Franks, Jr. ....................... 439/98 |
| 5,056,818 A | * | 10/1991 | Sadakata ....................... 280/777 |
| 5,221,065 A | * | 6/1993 | Siems ..................... F16L 3/137 |
| | | | 248/65 |
| D355,583 S | * | 2/1995 | Beauchane .................... D8/356 |
| 6,672,029 B2 | * | 1/2004 | Tucker ................ B28B 23/0056 |
| | | | 248/73 |
| 6,672,547 B1 | * | 1/2004 | Westerberg et al. ......... 248/74.1 |
| D505,847 S | * | 6/2005 | Kelleghan .......................... D8/40 |
| 8,030,569 B2 | * | 10/2011 | Nakata ........................... 136/250 |
| 8,322,297 B2 | * | 12/2012 | Petrenko ................. G09F 17/00 |
| | | | 116/173 |
| 8,526,200 B2 | * | 9/2013 | Miller et al. .................. 361/824 |
| 9,010,704 B2 | * | 4/2015 | Sirek ................... E04F 21/0015 |
| | | | 248/225.11 |
| 2010/0288894 A1 | | 11/2010 | Hopkins |

FOREIGN PATENT DOCUMENTS

JP 3023349 U 1/1996

* cited by examiner

*Primary Examiner* — Jonathan Liu
*Assistant Examiner* — Chiedu Chibogu
(74) *Attorney, Agent, or Firm* — Posz Law Group, PLC

(57) ABSTRACT

A bracket fixing hole that is configured to insert a screw part of a bracket fixing screw that is configured to mount the bracket to a bracket mounting part, a clamp hole that is configured to mount a cable clamp, and at least two notches that are configured to position the bracket to the at least two convex parts of the bracket mounting part are formed to a bracket. The bracket fixing hole and the clamp hole are faced on the opposed sides in such a manner that a first line segment that connects parts of the two notches is disposed between the holes. A second line segment that connects a center of the bracket fixing hole and a center of the clamp hole and the first line segment generally bisect each other at right angles. A gravity center is disposed on the side of the bracket fixing hole to the first line segment.

6 Claims, 5 Drawing Sheets

BRACKET AND ELECTRONIC DEVICE

CROSS-REFERENCE TO PRIOR APPLICATION

This application relates to and claims the benefit of priority from Japanese Patent Application number 2011-287496, filed on Dec. 28, 2011 the entire disclosure of which is incorporated herein by reference.

BACKGROUND

The present invention generally relates to a bracket that can be attached to a chassis of an electronic device. More specifically for instance, the present invention relates to a bracket that are configured to be able to attach a cable clamp that holds a wire and an electronic device.

In the past, a wire fixture has been used to fix a wire in an electronic device. For instance, a wire fixture is known in which a pair of flanges and a concave type wire press part are included and a screw hole is perforated in at least one flange and the concave type wire press part (see Literature 1). For this wire fixture, a wire can be fixed and an electronic part can be fixed.

Literature 1: Japanese Utility Model Registration No. 3023349

SUMMARY

A bracket is known as an example of a wire fixture. FIG. 1 is a configuration diagram of a bracket in accordance with a conventional example. FIG. 2 is a view showing a state in which a bracket in accordance with a conventional example is placed to a bracket mounting part. FIG. 3 is a view showing a state in which a cable clamp is mounted to a bracket in accordance with a conventional example for wiring.

A bracket 100 in accordance with a conventional example is in a flat plate shape. A bracket fixing hole 101 is perforated to the bracket 100. A cable clamp hole 102 is formed to the bracket 100.

As shown in FIG. 2, the bracket 100 is placed to a bracket mounting part 30 that has been formed in a chassis of an electronic device. After that, as shown in FIG. 3, the bracket 100 is mounted to the bracket mounting part 30 by using a bracket fixing screw 40. In the next place, a cable clamp 41 is mounted to the cable clamp hole 102 of the bracket 100, and a cable 43 is fixed to a cable fixing part 42 of the cable clamp 41.

In one process for producing an electronic device, as described above as shown in FIG. 2, the bracket 100 is placed to at least one bracket mounting part 30 in a chassis of an electronic device, and the bracket 100 is then mounted to the bracket mounting part 30 by using the bracket fixing screw 40 (shown in the figure).

However in the above process, by a vibrating motion that occurs at a point of time when the bracket 100 is placed to the bracket mounting part 30 or after the bracket 100 is placed to the bracket mounting part 30, the bracket 100 bows in a direction shown by an arrow A of FIG. 2 for instance. In other words, the bracket 100 is inclined in such a manner that the cable clamp hole 102 is on the lower side. Consequently, the bracket 100 may be dropped from the bracket mounting part 30 in some cases.

In the case in which the bracket 100 is inclined or is dropped as described above, a fastening step of the bracket fixing screw 40 requires a great care unfortunately. In particular, in the case in which the bracket fixing screw 40 is fastened by using an automated screw fastening device, the bracket fixing screw 40 cannot be fastened by using an automated screw fastening device. As a result, a screw fastening step by a human hand is required and a process man-hour is increased unfortunately.

The present invention was made in consideration of the above problems of the conventional art, and an object of the present invention is to provide a technique for placing a bracket to a bracket mounting part of an electronic device in an appropriate manner.

A bracket in accordance with a first aspect is a bracket that can be mounted to a chassis of an electronic device. The bracket is comprised of a bracket fixing hole that is configured to insert an attaching part of a bracket fixing member that is configured to mount the bracket to a bracket mounting part of the chassis, a clamp hole that is configured to mount a clamp that is configured to hold a prescribed object to the bracket, and at least two notches that are configured to position the bracket to the bracket mounting part. For the bracket, the bracket fixing hole and the clamp hole are faced on the opposed sides in such a manner that a first line segment that connects parts of the two notches is disposed between the holes. A second line segment that connects a center of the bracket fixing hole and a center of the clamp hole and the first line segment generally bisect each other at right angles. The second line segment can bisect at the center of the first line segment (a center between parts of the two notches). A gravity center is disposed on the side of the bracket fixing hole to the first line segment.

For a bracket in accordance with a second aspect, the bracket fixing hole can be an elongate hole that is extended in a direction bisecting at right angles with a line segment that connects the two notches.

For a bracket in accordance with a third aspect, a gravity center of the bracket can be disposed on the side of a central axis of the bracket fixing hole to an outer circumference of a contact part of the bracket that comes into contact with a peripheral seating face of an attaching hole to which the attaching part of the bracket mounting part is attached in the case in which the bracket is placed to the bracket mounting part.

For a bracket in accordance with a fourth aspect, the gravity center and the central axis of the bracket fixing hole can generally correspond with each other.

For an electronic device in accordance with a fifth aspect, the electronic device is comprised of a chassis and a bracket in accordance with any one of the first aspect to the fourth aspect.

At least two notches that are included in the bracket are positioned to at least two convex parts of the bracket mounting part.

For an electronic device in accordance with a sixth aspect, the bracket mounting part can be comprised of a first seating face on which the at least two convex parts are placed and a second seating face that comes into contact with the bracket. The second seating face can be above the level of the first-seating face.

A bracket can be placed to a bracket mounting part of an electronic device in an appropriate manner.

DESCRIPTION OF EMBODIMENTS

An embodiment in accordance with the present invention will be described with reference to drawings in the following. The embodiment that will be described in the following does not restrict the invention in accordance with the claims, and all of elements and all of combinations of the elements that will be described in the embodiments are not necessarily essential for the means for solving the problems of the invention.

Figure 1:
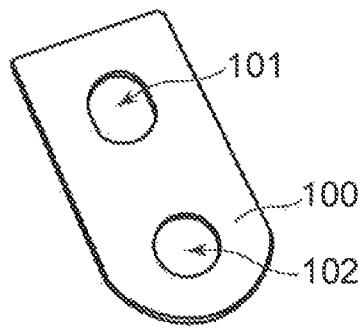
FIG. 1 is a configuration diagram of a bracket in accordance with a conventional example.
Figure 2:
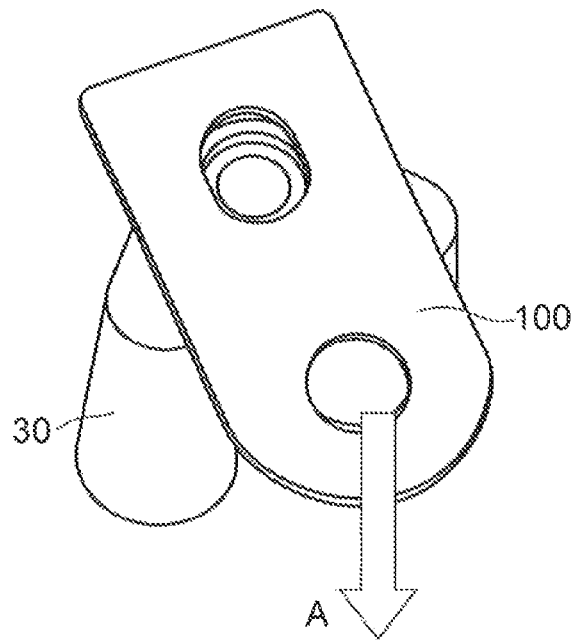
FIG. 2 is a view showing a state in which a bracket in accordance with a conventional example is placed to a bracket mounting part.
Figure 3:
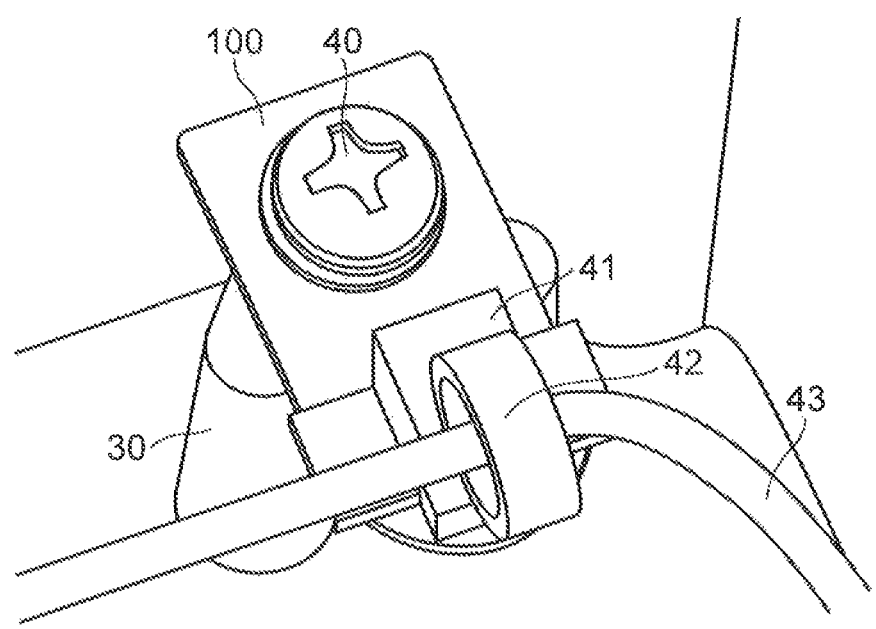
FIG. 3 is a view showing a state in which a cable clamp is mounted to a bracket in accordance with a conventional example for wiring.
Figure 4:
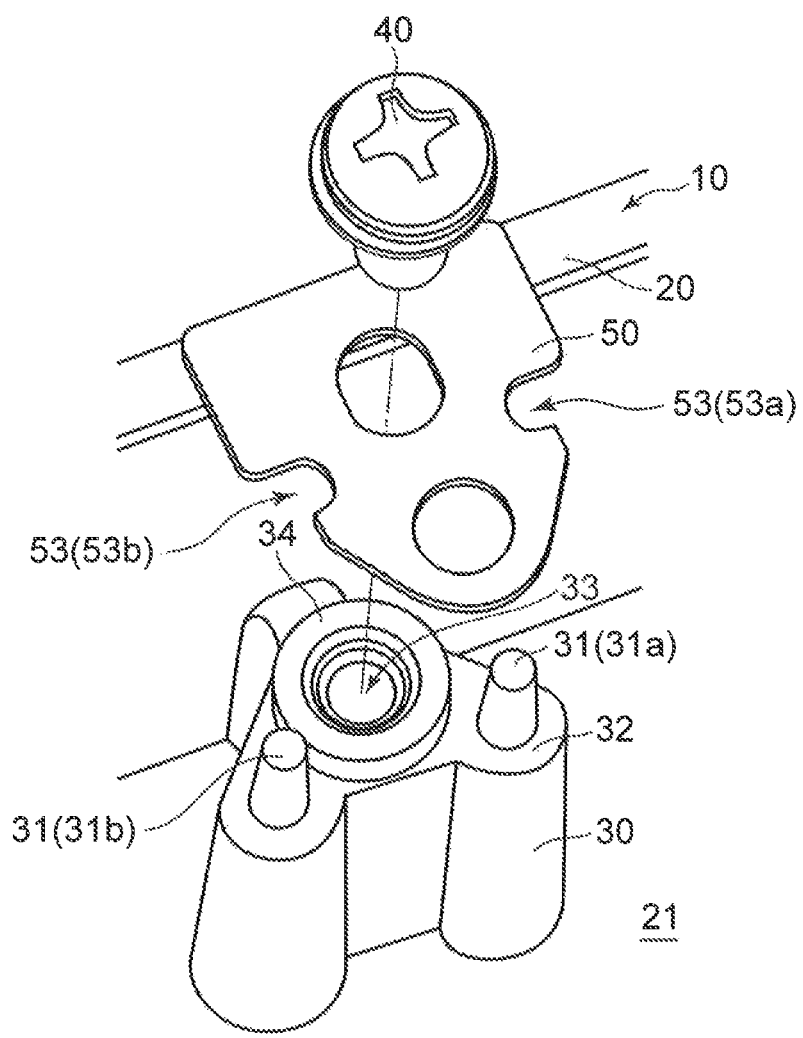
FIG. 4 is a configuration diagram of a bracket mounting part for an electronic device in accordance with an embodiment of the present invention.

FIG. 4 is a configuration diagram of a bracket mounting part for an electronic device in accordance with an embodiment of the present invention.

At least one bracket mounting part 30 that is configured to mount a bracket 50 is formed in a chassis 20 of an electronic device 10. The bracket mounting part 30 is formed vertically in a protruding manner on a bottom plate 21 of the chassis 20 of the electronic device 10 for instance. A bracket fixing screw hole 33 for a bracket fixing screw that is configured to fix the bracket 50 is formed on the upper face of the bracket mounting part 30. (Here, a direction is expressed based on a direction in the case in which the bottom plate 21 is disposed on a horizontal plane. Similar expression will also be used basically in other parts of this specification.) A seating face 34 on a periphery of the bracket fixing screw hole 33 for the bracket mounting part 30 is generally horizontal, and the seating face 34 comes into contact with a lower face of the bracket 50 in the case in which the bracket 50 is placed on the upper face of the bracket mounting part 30.

Two bosses 31a and 31b that operate for positioning the bracket 50 in the case in which the bracket 50 is mounted are formed in a standing position on the upper face of the bracket mounting part 30 (two or more bosses can also be formed, and the at least two convex parts are the two bosses (31a, 31b)). Each of the bosses 31a and 31b is in a generally circular truncated cone shape. The bracket 50 can be positioned at an appropriate location of the bracket mounting part 30 by the bosses 31a and 31b and notches 53a and 53b that have been formed in the bracket 50 (two or more notches 53 can also be formed). The boss 31 operates for preventing a rotation of the bracket 50 in the case in which the bracket 50 is mounted by fastening the bracket fixing screw 40. In the example shown in the figure, the seating face 34 of the bracket fixing screw hole 33 is above the level of the seating face 32 on which the boss 31 is formed. By this configuration, in the case in which the bracket 50 is mounted to the bracket mounting part 30, the bracket 50 can be prevented from interfering in (being placed on a root part of the boss 31.

Figure 5:
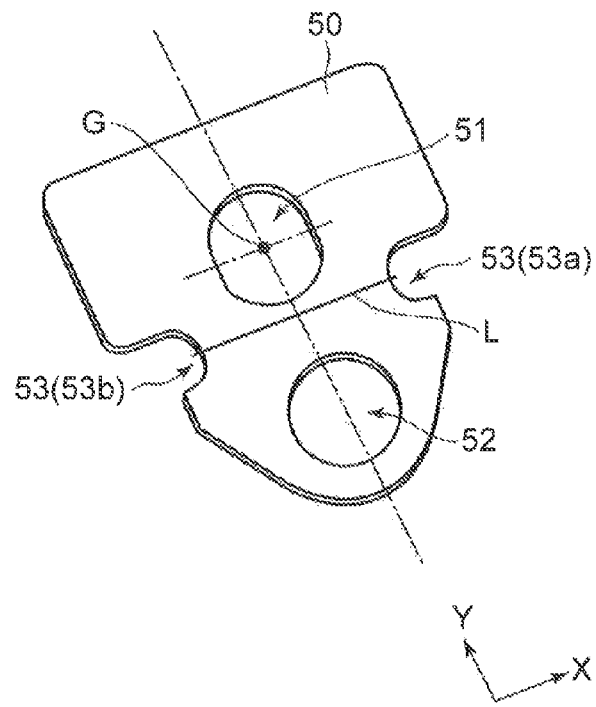
FIG. 5 is a configuration diagram of a bracket in accordance with an embodiment of the present invention.

FIG. 5 is a configuration diagram of a bracket in accordance with an embodiment of the present invention.

The bracket 50 is in a flat plate shape. A bracket fixing hole 51 that is configured to insert an axis (an attaching part) of the bracket fixing screw 40 (an example of bracket fixing member) that is configured to mount the bracket 50 to the bracket mounting part 30, a clamp hole 52 that is configured to mount a cable clamp, and two notches 53a and 53b that are configured to position the bracket 50 to the bosses 31a and 31b in the case in which the bracket 50 is placed on the bracket mounting part 30 are formed to the bracket 50.

In the present embodiment, since a cross section of an external shape of the boss 31 is a circle on the horizontal face, a notch 53 is formed in a circular arc shape. The notch 53 is formed in a shape that is corresponded to an external shape of the boss 31. Here, a line L shown in FIG. 5 is a first line segment that connects a part of the notch 53a and a part of the notch 53b in such a manner that a distance between the part of the notch 53a and the part of the notch 53b is the shortest. The first line segment L is almost equivalent to a line that connects a central axis of the boss 31a and a central axis of the boss 31b in the case in which the bracket 50 is placed to the bracket mounting part 30. Consequently, it can be said that the first line segment L is a line that includes a supporting point when the bracket 50 is inclined in such a manner that the clamp hole 52 is on the lower side in the case in which the bracket 50 is placed to the bracket mounting part 30. The first line segment L can also be a line that is provided with a certain degree of width. Here, a direction of the first line segment L is an X axis and a direction perpendicular to the X axis is a Y axis as shown in FIG. 5.

The bracket fixing hole 51 and the clamp hole 52 are placed on the opposed sides in such a manner that the first line segment L that connects the parts of the two notches 53a and 53b is disposed between the holes. In the present embodiment, a distance of a center of the bracket fixing hole 51 from the first line segment L and a distance of a center of the clamp hole 52 from the first line segment L are almost equivalent to each other. A second line segment (not shown) that connects a center of the bracket fixing hole 51 and a center of the clamp hole 52 can intersect with a center of the first line segment L.

A length in a direction of an X axis of the bracket fixing hole 51 is longer than a diameter of a screw part of the bracket fixing screw 40 and is shorter than a diameter of a head part of the bracket fixing screw 40. Moreover, a length in a direction of a Y axis of the bracket fixing hole 51 is longer than a length in a direction of an X axis of the bracket fixing hole 51. In other words, the bracket fixing hole 51 is an elongate hole that is extended in a direction of a Y axis. The bracket 50 is configured in such a manner that a central axis of the bracket fixing hole 51 and a central axis of the bracket fixing screw hole 33 generally correspond with each other in the case in which the bracket 50 is placed to the bracket mounting part 30. However, it can be thought that a central axis of the bracket fixing hole 51 and a central axis of the bracket fixing screw hole 33 are out of alignment to a certain degree in a practical sense. Here, the bracket fixing hole 51 is an elongate hole as described, above, even in the case in which a central axis of the bracket fixing hole 51 and a central axis of the bracket fixing screw hole 33 are out of alignment to a certain degree, an axis of the bracket fixing screw 40 can be inserted into the bracket fixing hole 51, and the bracket fixing screw 40 can be fastened in an appropriate manner.

The bracket 50 is formed in a shape in such a manner that the central axis of the bracket fixing hole 51 and the gravity center G of the bracket 50 generally correspond with each other. Since a central axis of the bracket fixing hole 51 and a central axis of the bracket fixing screw hole 33 generally correspond with each other in the case in which the bracket 50 is placed to the bracket mounting part 30, a central axis of the bracket fixing screw hole 33 of the bracket mounting part 30 and the center of gravity G of the bracket 50 generally correspond with each other in the case in which the bracket 50 is placed to the bracket mounting part 30.

In the present embodiment, a width in a direction of an X axis of the bracket 50 on the side of the bracket fixing hole 51 from the first line segment L is larger than a width in a direction of an X axis of the bracket 50 on the side of the clamp hole 52. Moreover, the bracket 50 on the side of the clamp hole 52 is in a generally triangular shape in such a pattern that a width in a direction of an X axis is smaller on a leading end side of the bracket 50.

Since the bracket 50 is in a flat plate shape and in a shape as described above, the bracket 50 can be fabricated only in a press process for instance. Consequently, a reduction of a metallic mold cost and a reduction of working processes can be implemented. The bracket 50 can also be fabricated in a process other than a press process.

Figure 6:
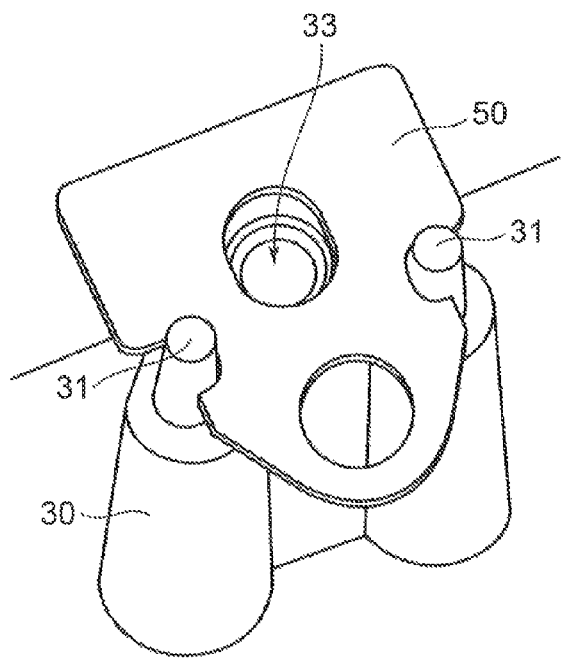
FIG. 6 is a view showing a state in which a bracket in accordance with an embodiment of the present invention is placed to a bracket mounting part.

FIG. 6 is a view showing a state in which a bracket in accordance with an embodiment of the present invention is placed to a bracket mounting part.

In the case in which the bracket 50 is placed to the bracket mounting part 30 as shown in FIG. 6, the bracket 50 is positioned by the boss 31 above the bracket mounting part 30 and is in a generally horizontal state. Here, the lower face of the bracket 50 is supported by the seating face 34 on a periphery of the bracket fixing screw hole 33, and the gravity center of the bracket 50 and a central axis of the bracket fixing screw hole 33 generally correspond with each other. Consequently, the bracket 50 can be prevented from being inclined in an appropriate manner, and the bracket 50 can be maintained to be in a horizontal state.

After the bracket 50 is placed to the bracket mounting part 30 as described above, a step proceeds to a screw fastening process in which the bracket 50 is mounted by the bracket fixing screw 40. In the case in which a plurality of brackets 50 is mounted to the electronic device 10, after a plurality of brackets 50 is placed, a step proceeds to a screw fastening process. For the bracket 50 in accordance with the present embodiment, even in the case in which other bracket 50 is placed or a screw fastening is carried out to other bracket 50, the bracket 50 can be prevented from being inclined or dropped and the bracket 50 can be maintained to be in a horizontal state. Consequently, a screw fastening can be carried out by using an automated screw fastening device in an appropriate manner.

A process for mounting a cable clamp 60 is carried out after the screw fastening process.

Figure 7:
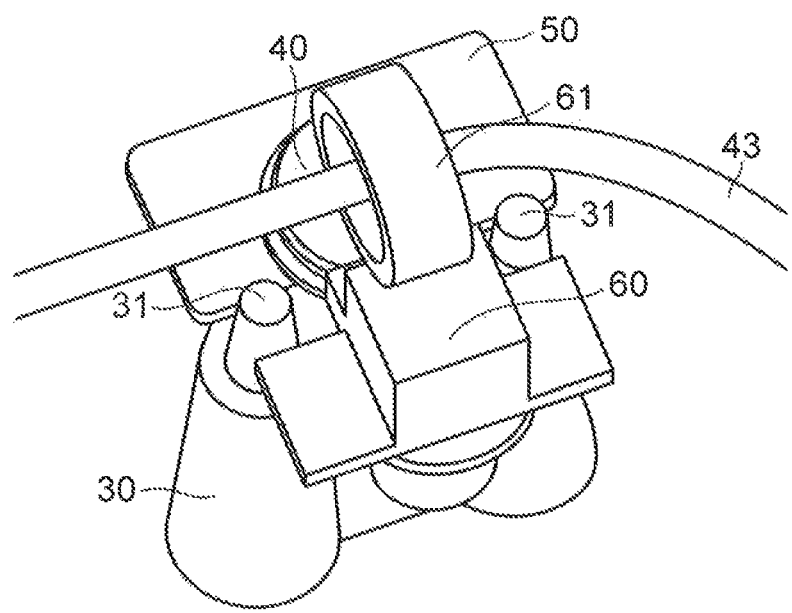
FIG. 7 is a view showing a state in which a cable clamp is mounted to a bracket in accordance with an embodiment of the present invention for wiring.

FIG. 7 is a view showing a state in which a cable clamp is mounted to a bracket in accordance with an embodiment of the present invention for wiring.

A cable clamp 60 is mounted to a clamp hole 52 of the bracket 50, and a cable 43 is fixed by a cable fixing part 61 of the cable clamp 60 as shown in FIG. 7. In the present embodiment, the cable clamp 60 is formed in such a manner that the cable fixing part 61 that is configured to insert, and fix the cable 43 is shifted away from a central axis of the clamp hole 52. In the present embodiment, the cable clamp 60 is mounted in such a manner that the cable fixing part 61 is on the side of the bracket fixing screw 40. Consequently, the cable 43 can be held at a position close to the bracket fixing screw 40, and a load that is applied to parts that are configured to mount the bracket 50 (such as the bracket fixing screw 40 and the bracket mounting part 30) can be reduced.

While the preferred embodiment in accordance with the present invention has been described above, the present invention is not restricted to the embodiment, and the present invention can be applied to a wide variety of other modes.

In the present embodiment for instance, the central axis of the bracket fixing hole 51 of the bracket 50 and the gravity center G of the bracket 50 generally correspond with each other. However, the present invention is not restricted to the embodiment, and the bracket 50 can also be formed in such a manner that the gravity center G of the bracket 50 is located on the side of the bracket fixing hole 51 from the line L that connects two notches 53. By this configuration, the bracket 50 can also be suppressed from being inclined in an appropriate manner. Moreover, in the case in which the seating face 34 on a periphery of the bracket fixing screw hole 33 is a flat surface and the lower face of the bracket 50 is supported by the seating face 34 when the bracket 50 is placed to the bracket mounting part 30, the gravity center G of the bracket 50 can also be located on the seating face 34 or on the side closer to a central axis of the bracket fixing screw hole 33 from the seating face 34. By this configuration, the bracket 50 can also be suppressed from being inclined in an appropriate manner.

In the present embodiment for instance, the bracket 50 is in a flat plate shape. However, the present invention is not restricted to the embodiment, and the bracket 50 can also be formed in such a manner that a part of a flat plate is folded for instance. Moreover in the present embodiment for instance, the gravity center G is located at a predetermined position in accordance with a shape of the bracket 50 is in a flat plate shape. However, the present invention is not restricted to the embodiment, and the gravity center G can be adjusted to be at a predetermined position by adding a member of deadweight. In other words, it is preferable that the gravity center S can be aligned to be at a predetermined position.

In the present embodiment, a cable clamp is mounted for the bracket 50 for instance. However, the present invention is not restricted to the embodiment, and the present invention can also be applied to a bracket in which a clamp that is configured to hold other than a cable is mounted. Moreover, the electronic device 10 can also be a transportable electronic device that can be transported before the bracket 50 is fixed to the bracket mounting part 30 after the bracket 50 is placed to the bracket mounting part 30 (for instance, an in-car power-supply unit that is installed to a car such as a hybrid vehicle (for instance, a switching power-supply unit such as a DC-DC converter)).

What is claimed is:

1. A bracket for being mounted on a bracket mounting part of a chassis of an electronic device, comprising:
   a bracket fixing hole defined in the bracket, the bracket fixing hole is configured to insert an attaching part of a bracket fixing member, that the bracket fixing member is configured to fix the bracket to a bracket mounting part of the chassis;
   a clamp hole defined in the bracket, the clamp hole is configured to mount a clamp, the clamp is configured to hold a prescribed object to the bracket; and
   at least two notches defined in the bracket, the at least two notches are configured to position the bracket on the bracket mounting part,
   wherein a first line segment that is an imaginary line is disposed on the bracket between the clamp hole and the bracket fixing hole, wherein the first line segment defines a bracket-fixing-hole side of the bracket in which the bracket fixing hole is defined and a clamp-hole side of the bracket in which the clamp hole is defined, on opposite sides from each other across the first line segment,
   wherein a second line segment is an imaginary line, and the first line segment and the second line segment generally bisect each other at right angles, and wherein a center of gravity of the bracket is located on the bracket-fixing-hole side of the bracket, wherein the bracket is in a flat plate shape, wherein, when the bracket is positioned on but not fixed to the bracket mounting part of the chassis, the bracket is not inclined relative to a top surface of a bracket mounting part and not dropped from the bracket mounting part.

2. A bracket according to claim 1, wherein the bracket fixing hole is an elongate hole that is extended in a direction along the second line segment.

3. A bracket according to claim 1, wherein the center of gravity of the bracket is located in the bracket fixing hole.

4. A bracket according to claim 1, wherein the center of gravity of the bracket is located at the center of the bracket fixing hole.

5. An electronic device comprising:
a chassis, and
a bracket,
the chassis comprising:
  a bracket mounting part that is configured to place the bracket; and
  at least two bosses that are defined on the bracket mounting part, the bracket comprising:
  a bracket fixing hole that is configured to insert an attaching part of a bracket fixing member that is configured to mount the bracket to the bracket mounting part of the chassis;
  a clamp hole that is configured to mount a clamp that is configured to hold a prescribed object to the bracket; and
  at least two notches that are configured to position the bracket relative to the at least two bosses of the bracket mounting part, wherein a first line segment that is an imaginary line is disposed on the bracket between the clamp hole and the bracket fixing hole, wherein the first line segment defines a bracket-fixing-hole side of the bracket in which the bracket fixing hole is defined and a clamp-hole side of the bracket in which the clamp hole is defined, on opposite sides from each other across the first line segment, wherein a second line segment is an imaginary line, and the first line segment and the second line segment generally bisect each other at right angles, and wherein a center of gravity of the bracket is located on the bracket-fixing-hole side of the bracket, wherein, when the bracket s positioned on but not fixed to the bracket mounting part of the chassis, the bracket is not inclined relative to a top surface of a bracket mounting part and not dropped from the bracket mounting part.

6. An electronic device according to claim 5, wherein the bracket mounting part comprises of a first seating face on which the at least two bosses are disposed and a second seating face that comes into contact with the bracket, and wherein the second seating face is above the level of the first seating face.

* * * * *